(12) United States Patent
Shkalim et al.

(10) Patent No.: US 12,143,063 B2
(45) Date of Patent: Nov. 12, 2024

(54) CORRUGATED TRANSPARENT TOP PANEL FOR EITHER INCREASING OR DECREASING HARVESTING OF SOLAR RADIATION AND METHODS THEREOF

(71) Applicants: Reuven Shkalim, Holon (IL); Paz Levi Tsedek, Holon (IL); Rafi Levi, Netanya (IL)

(72) Inventors: Reuven Shkalim, Holon (IL); Paz Levi Tsedek, Holon (IL); Rafi Levi, Netanya (IL)

( * ) Notice: Subject to any disclaimer, the term of this patent is extended or adjusted under 35 U.S.C. 154(b) by 554 days.

(21) Appl. No.: 17/429,618

(22) PCT Filed: Feb. 11, 2020

(86) PCT No.: PCT/IL2020/050161
§ 371 (c)(1),
(2) Date: Aug. 9, 2021

(87) PCT Pub. No.: WO2020/165898
PCT Pub. Date: Aug. 20, 2020

(65) Prior Publication Data
US 2022/0140779 A1    May 5, 2022

(30) Foreign Application Priority Data
Feb. 11, 2019  (IL) .......................................... 264782

(51) Int. Cl.
*H02S 40/22*   (2014.01)
*H01L 31/054*  (2014.01)

(52) U.S. Cl.
CPC ............ *H02S 40/22* (2014.12); *H01L 31/054* (2014.12)

(58) Field of Classification Search
CPC ............................... H01L 31/054; H02S 40/22
See application file for complete search history.

(56) References Cited

U.S. PATENT DOCUMENTS

| 7,128,975 B2 | 10/2006 | Inomata |
| 2008/0196761 A1 | 8/2008 | Nakano et al. |
| 2010/0252107 A1 | 10/2010 | Suga |
| 2014/0000710 A1* | 1/2014 | Nakahara ............ H01L 31/0543 359/619 |
| 2017/0148931 A1 | 5/2017 | Harder et al. |

FOREIGN PATENT DOCUMENTS

| EP | 2687877 A1 | 1/2014 |
| KR | 20130091517 A * | 8/2013 |
| WO | 2011098212 A2 | 8/2011 |

(Continued)

OTHER PUBLICATIONS

Machine translation of KR-20130091517-A, Yanagawa et al. (Year: 2013).*

(Continued)

*Primary Examiner* — Mayla Gonzalez Ramos
(74) *Attorney, Agent, or Firm* — The Roy Gross Law Firm, LLC; Roy Gross

(57) ABSTRACT

The present invention generally pertains to a corrugated transparent top panel provided useful for either increasing or decreasing harvesting of solar radiation and to methods thereof. A special use of this panel is in photovoltaic cells, solar cells, walls, windows and agricultural structures.

19 Claims, 7 Drawing Sheets

(56) References Cited

FOREIGN PATENT DOCUMENTS

WO      2011098212 A3    4/2012
WO      2012169602 A1    12/2012

OTHER PUBLICATIONS

International Search Report for PCT Patent Application No. PCT/IL2020/050161 dated May 31, 2020, 4 pp.
International Written Opinion for PCT Patent Application No. PCT/IL2020/050161 dated May 31, 2020, 5 pp.
Sampaia, Priscila Gonzalves Vasconcelos, and Mario Orestes Aguirre Gonzalez. "Photovoltaic solar energy: Conceptual framework." Renewable and Sustainable Energy Reviews 74 (2017): 590-601.
Prehoda, Emily W., and Joshua M. Pearce. "Potential lives saved by replacing coal with solar photovoltaic electricity production in the US." Renewable and Sustainable Energy Reviews 80 (2017): 710-715.
Israel Patent Office, Office Action (Notice of Objection in Accordance with Regulation) for Israeli Patent Application 264782, dated Jul. 7, 2019, 5pp.
European Search Report for Application No. 20754140.0, mailed Mar. 10, 2022, 7 pp.
PCT Examination Report—European Patent Application 20754140.0, dated Jul. 12, 2023, 5pp.

* cited by examiner

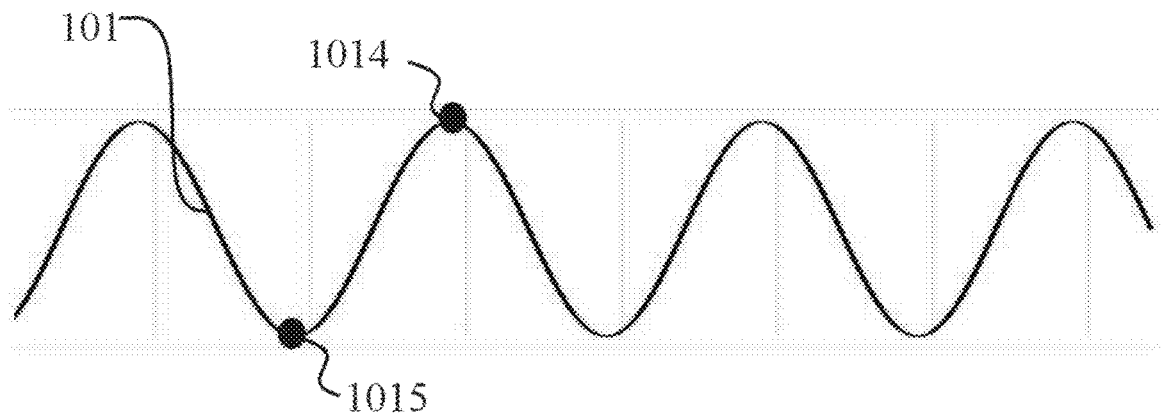
Fig. 2A
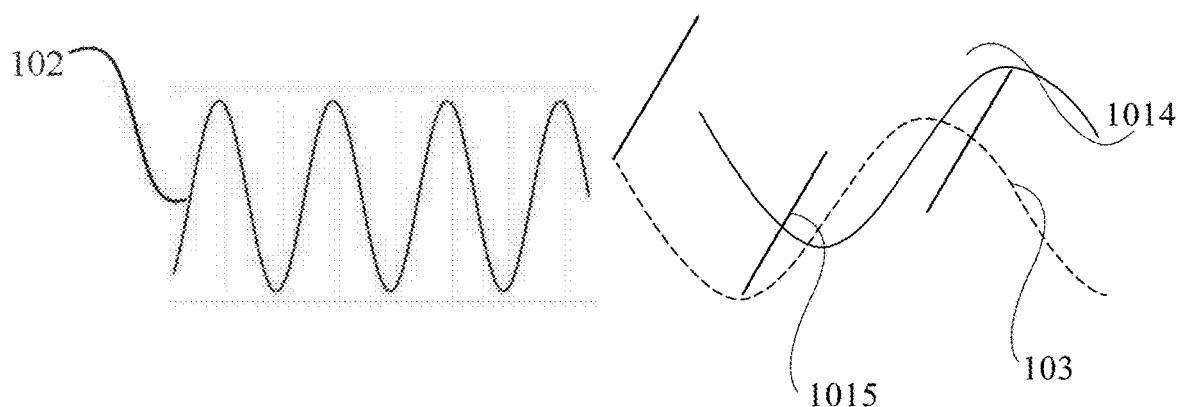
Fig. 2B
Fig. 2C

CORRUGATED TRANSPARENT TOP PANEL FOR EITHER INCREASING OR DECREASING HARVESTING OF SOLAR RADIATION AND METHODS THEREOF

CROSS-REFERENCE TO RELATED APPLICATIONS

This application is a U.S. National Phase filing under 35 U.S.C. 371 of International (PCT) Patent Application No. PCT/IL2020/050161, filed Feb. 11, 2020, which claims priority from Israeli Patent Application No. 264782, filed Feb. 11, 2019, the contents of which are all incorporated herein by reference in their entirety.

FIELD OF THE INVENTION

The present invention generally pertains to a corrugated transparent top panel provided useful for increasing or decreasing harvesting of solar radiation and to methods thereof.

BACKGROUND OF THE INVENTION

Coal combustion for electrical generation not only contributes to high levels of carbon dioxide emissions with the concomitant climate disruption, but also to conventional air pollution Coal fired electrical power plants released 23% of air pollutants and the largest contributors to U.S. carbon dioxide emission is electrical generation (31%). While coal use is declining due to natural gas resources and renewable energy growth, coal combustion still accounts for roughly 30-40% of U.S. carbon dioxide pollution, contributing to ever-expanding climate change. Air pollutants are classified into four groups: gaseous, persistent organic, heavy metals, and particulate matter.

The literature shows a positive correlation between mortality and morbidity due to outdoor air pollution. Specifically, it is well established in the historical and current literature that coal combustion results in emissions of carbon dioxide, methane (gaseous pollutants), particulate matter, nitrogen and sulfur oxides (gaseous), and mercury (heavy metal). Poor air quality from coal is well known to adversely affect human health including: mortality and morbidity effects on respiratory, cardiovascular, nervous, urinary, and digestive systems.

A full life cycle accounting of coal reveals an estimated $523.3 billion in damages (including social and environmental externalities), which is roughly $0.27/kWh generated. Thus, the externalities of coal-fired electricity are more than double the average cost of residential electricity in the U.S. of $0.12/kWh. Although coal is detrimental in all stages of its life cycle, combustion is the stage with the heaviest health burden in the form of mortality and morbidity effects due to outdoor air pollutants/emissions, see Prehoda, Emily W., and Joshua M. Pearce. "Potential lives saved by replacing coal with solar photovoltaic electricity production in the US." *Renewable and Sustainable Energy Reviews* 80 (2017): 710-715.

Compared to aforesaid conventional power generation sources, photovoltaic technology does not bring the serious environmental problems that these sources cause during generation, such as climate change, global warming, air pollution, acid rain and so on. Another advantage in relation to fossil fuels is that solar energy does not need to be extracted, refined or transported to the generation site, which is close to the load. However, during its life cycle, it consumes a large amount of energy and emits some greenhouse gases in some stages (manufacturing process of solar cells, assembly of photovoltaic modules and transport of material, among others).

Photovoltaic technologies, consume per unit of electricity produced, 64 times more material resources, 7 times more human resources and 10 times more capital than nuclear technology. Although this data is biased, this is a clear indication of the extreme inefficiency of PV technologies in regions of moderate sunshine to help achieve the goal of providing a resource-efficient, efficient electricity supply system. Due to the intermittent nature of electricity production in these regions, parallel electricity supply infrastructure needs to be provided, see Sampaio, Priscila Gonçalves Vasconcelos, and Mario Orestes Aguirre González. "Photovoltaic solar energy: Conceptual framework." *Renewable and Sustainable Energy Reviews* 74 (2017): 590-601.

Nevertheless, solar cells and photovoltaic cells characterized by various disadvantages, including limitations in the availability of systems on the market; high initial cost; need a relatively large area of installation; high dependence on technology development; and geographical conditions (solar irradiation). The scope of the present invention is to overcome at least a part of those drawbacks by introducing means and method for significantly decreasing efficiency thereby reducing required installation area and reducing dependency on solar & geographical conditions.

SUMMARY OF THE INVENTION

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

It is hence one object of the invention to disclose, e.g., in the industry photovoltaic or solar cells or in any other relevant technology, e.g., as defined below, a corrugated transparent top panel.

Another object of the invention is to disclose the panel as defined above, wherein the panel comprises p plains, p is an integer number being equal or greater than 1, at least one of said p plains is corrugated in a sinusoidal-like wave(s).

Another object of the invention is to disclose the panel as defined in any of the above, wherein the panel is defined by $$y(t)=A \sin(2\pi ft+\varphi)=A \sin(\omega t+\varphi) \qquad (1)$$

where:

A=the amplitude, the peak deviation of the function from zero;

f=the ordinary frequency, the number of oscillations (cycles) that occur each second of time;

$\omega=2\pi f$, the angular frequency, the rate of change of the function argument in units of radians per second; and $\varphi$=the phase, specifies (in radians) where in its cycle the oscillation is at t=0.

Another object of the invention is to disclose the panel as defined in any of the above, wherein the panel comprises primary, secondary or tertiary at least partially transparent lens-like arrangement(s), each of which of said arrangements is characterized by either 2D or 3D configuration, said configuration is selected from a group consisting of spheres, bubbles or partial-bubble-shapes, rectangular (including triangular, prisms, pyramids and diamonds), fractal shape, concave lens-like arrangement, cylinder, convex lens-like arrangement, conjugates of the same, mixture and combination thereof.

Another object of the invention is to disclose the panel as defined in any of the above, wherein the panel average size of said primary, secondary or tertiary at least partially transparent arrangements is ranging from 0.01 cm to 1 cm, from 1 cm to 100 cm, from 100 cm to 1500 cm; from 0.01 µm to 1 µm, from 1 µm to 100 µm, from 100 µm to 1,500 µm; from 1 nm to 100 nm, from 100 nm to 500 nm, from 500 nm to 1,000 nm.

Another object of the invention is to disclose the panel as defined in any of the above, wherein the panel primary, secondary or tertiary arrangements are at least partially provided in a gas phase, liquid phase, solid phase and any mixture or combination thereof.

Another object of the invention is to disclose the panel as defined in any of the above, wherein the panel at least one of said primary, secondary or tertiary arrangements is made of flexible material, semi-flexible material or inflexible material.

Another object of the invention is to disclose the panel as defined in any of the above, wherein at least one of said primary, secondary or tertiary arrangements is made of polymer(s), glass(es), sol(s), gel(s), sol-gel(s), composite material(s) and any mixture or combination thereof.

Another object of the invention is to disclose the panel as defined in any of the above, wherein at least one of said primary, secondary or tertiary arrangements is colored.

Another object of the invention is to disclose the panel as defined in any of the above, wherein the panel is at least partially made of at least one composition and at least one additive; said additive is selected from a group consisting of diluent, solvent, UV blocker, UN enhancer, dye, pigment, stabilizer, filler, fiber, net, structural support, fire retardant, anti-corrosive pigment, mixtures and combination thereof.

Another object of the invention is to disclose the panel as defined in any of the above, wherein the panel comprises at least one porous portion.

Another object of the invention is to disclose the panel as defined in any of the above, wherein at least one portion of the panel is made of gas permeable material.

Another object of the invention is to disclose the panel as defined in any of the above, wherein the permeable material is gas-selective thereby provides transfer of at least one first gas whilst is sealed for at least one second gas.

Another object of the invention is to disclose the panel as defined in any of the above, wherein the panel comprises one or more members of a group consisting of UV blocking agents and compositions thereof; IR blocking agents and compositions thereof, NIR blocking agents and compositions thereof visible light blocking agents and compositions thereof; blocking agents and compositions thereof utilizable for blocking predefined spectra of solar radiation; mixtures and combination thereof.

Another object of the invention is to disclose a surface of matter, said surface comprising at least one panel as defined in any of the above.

Another object of the invention is to disclose an item of manufacture comprising at least one panel as defined in any of the above.

Another object of the invention is to disclose the panel as defined in any of the above, wherein at least one portion of the panel or all the panel is flexible, semi-flexible or rigid.

The panel as defined above, wherein said panel comprises a first surface and a second opposite surface said second surface is interconnected with or otherwise comprises an adhesive, glue or fixating means.

Another object of the invention is to disclose a tile made of two or more panels as defined in any of the above.

Another object of the invention is to disclose a use of a panel as defined in any of the above, at partially made for UV at least partial blocking; IR at least partial blocking, NIR at least partial blocking; visible light at least partial blocking; at least partial blocking of predefined spectra of solar radiation and a combination thereof.

Another object of the invention is to disclose a use of a panel as defined in any of the above for increasing the efficiency of harvesting of solar radiation.

It is another object of the invention is to disclose a transparent top panel useful for providing a favorable incident angle for solar light at the exterior surface of a photovoltaic or solar cell, said transparent top panel comprising an exterior surface, having a layer configured for scattering and diffracting a solar light being incident thereto; wherein said layer comprises distance-$d_1$-spaced primary corrugations made of at least one first transparent composition; said primary corrugations further comprising distance-$d_2$-spaced secondary corrugations made of at least one second transparent composition by means of varying of a thickness or a refractive index thereof within said primary corrugations; said first distance $d_1$ being at least 5 times said second distance $d_2$; said secondary corrugations further comprising distance $d_3$-spaced tertiary corrugations made of at least one third transparent composition by means of varying of a thickness or a refractive index thereof within said secondary corrugations; said second distance $d_2$ being at least 5 times said third distance $d_3$;

wherein said primary corrugations form a regular, evenly-spaced pattern on said substrate, said secondary corrugations form a regular, evenly-spaced pattern on said primary corrugations and said tertiary corrugations form a regular, evenly-spaced pattern on said secondary corrugations;

further wherein a cross-section of said tertiary corrugations comprises a plurality of different slopes.

It is another object of the invention is to disclose the transparent top panel as defined above, wherein a first shape of said primary corrugations is selected from a group consisting of sinusoidal cross-section, circular cross-section, ellipsoidal cross-section and lenticular.

It is another object of the invention is to disclose the transparent top panel as defined above, wherein said first shape of said primary corrugations extends, in a direction perpendicular to said cross section, across all of said exterior surface.

It is another object of the invention is to disclose the transparent top panel as defined above, wherein a second shape of said primary corrugations is selected from a group consisting of tubular, cubic, truncated rectangular pyramid, spherical, and ellipsoidal.

It is another object of the invention is to disclose the transparent top panel as defined above, wherein a first shape of said secondary corrugations is selected from a group consisting of sinusoidal cross-section, circular cross-section, ellipsoidal cross-section and lenticular.

It is another object of the invention is to disclose the transparent top panel as defined above, wherein said first shape of said secondary corrugations extends, in a direction perpendicular to said cross section, across substantially all of said exterior surface.

It is another object of the invention is to disclose the transparent top panel as defined above, wherein a second shape of said secondary corrugations is selected from a group consisting of tubular, cubic, truncated rectangular pyramid, spherical, and ellipsoidal.

It is another object of the invention is to disclose the transparent top panel as defined above, wherein a first shape of said tertiary corrugations is selected from a group consisting of sinusoidal cross-section, circular cross-section, ellipsoidal cross-section and lenticular.

It is another object of the invention is to disclose the transparent top panel as defined above, wherein said first shape of said tertiary corrugations extends, in a direction perpendicular to said cross section, across all of said exterior surface.

It is another object of the invention is to disclose the transparent top panel as defined above, wherein a second shape of said tertiary corrugations is selected from a group consisting of tubular, cubic, truncated rectangular pyramid, spherical, and ellipsoidal.

It is another object of the invention is to disclose the transparent top panel as defined above, wherein at least one of the following is true: a cross-section of a member of a group consisting of said primary corrugations, said secondary corrugations and any combination thereof comprises a plurality of different slopes; and at least a portion of a cross-section of a member of a group consisting of said primary corrugations, said secondary corrugations, said tertiary corrugations and any combination thereof is curved.

BRIEF DESCRIPTION OF THE FIGURES

The accompanying drawings, which are incorporated in and constitute a part of this specification, illustrate aspects of the present teachings and together with the description, serve to explain principles of the present teachings. In the figures:

FIG. 2 schematically and in an out-of-scale manner illustrates in a non-limiting manner several embodiments of corrugated transparent panel (100) according to another embodiment of the invention;

DETAILED DESCRIPTION OF THE PREFERRED EMBODIMENTS

Figure 1:
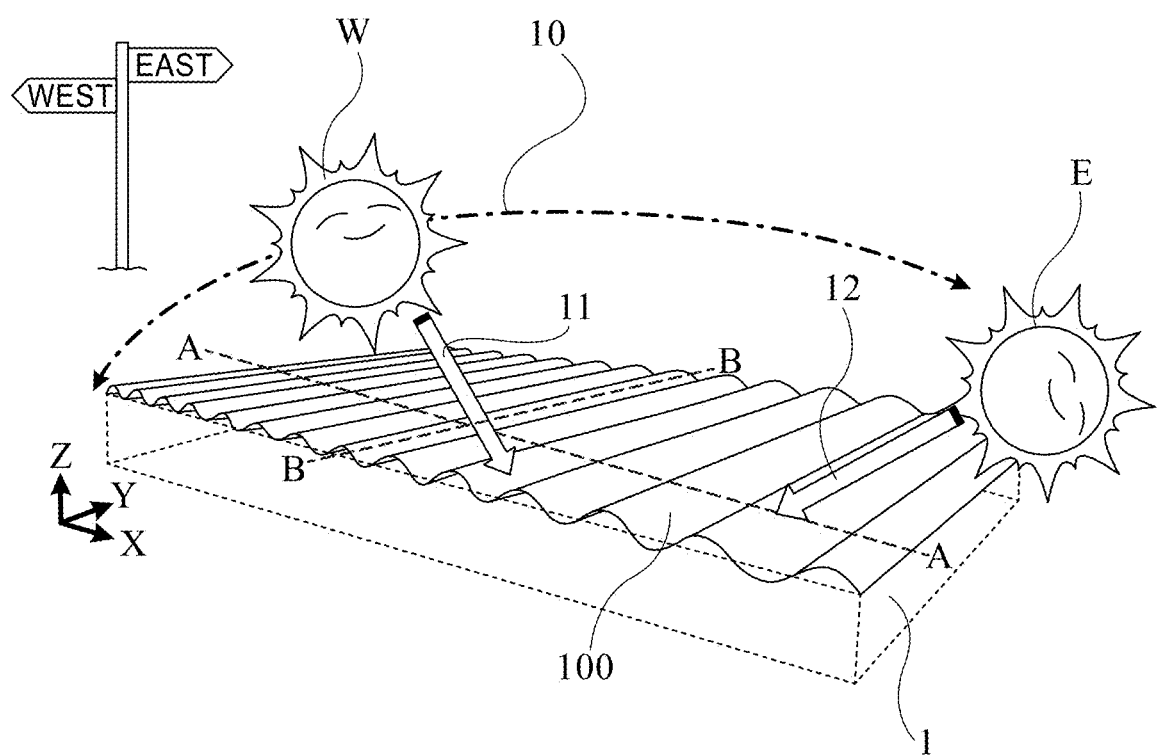
FIG. 1 illustrates schematically and in an out-of-scale manner an upper surface of either a photovoltaic cell or solar cell (1) according to one embodiment of the invention.

Reference will now be made in detail to implementations of the present teachings, an example of which is illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific implementations in which may be practiced. These implementations are described in sufficient detail to enable those skilled in the art to practice these implementations and it is to be understood that other implementations may be utilized and that changes may be made without departing from the scope of the present teachings. The following description is, therefore, merely exemplary.

The present invention generally pertains to a corrugated transparent top panel provided useful for either increasing or decreasing harvesting of solar radiation and to methods thereof. A special use of this panel is in photovoltaic cells, solar cells, windows, walls and agricultural structures.

The technology of the present invention is provided useful in various industries and utilizations, including, inter alia, coatings, film, patch, window shade that are widely used in all forms of human endeavor. Examples include commercial, industrial, medical, personal, residential and social. Industrial coatings, treatments and paint are used in many applications such as building interiors/exteriors, computers, consumer electronic devices, cosmetics, electrical, fabrics, furniture, home appliances, infrastructure, internal and/or external structural surfaces, luxury goods, telecommunications, mechanical and industrial equipment, media, medical devices and medical supplies. In addition to aesthetics of appearance, color, decoration, design and finish coatings are used for protection e.g. impermeability, hydrophobicity, shielding and resistance to electromagnetic, radio frequency, ultraviolet or other radiation. The acquisition of raw materials, manufacture production, transportation and application of such coatings consumes enormous amounts of energy and produces even greater volumes of greenhouse gasses, toxic waste products and other harmful emissions. Conventional coatings contain a high proportion of toxic materials and petrochemical products or derivatives. In the last half-century titanium and other metal oxides have been identified as possessing particular light scattering/absorbing properties. Such materials have been incorporated into many of these coatings.

This technology is provided for use in a variety of sectors and structural forms e.g. automotive, aviation, construction, engineering, transportation, etc. will realize substantial economic and ecological benefits. The invention described herein provides a method to influence temperature-dependent heat transport by modifying spectral emissivity and other features. The method concerns the engineering of active/passive wavelength and temperature dependent tunable coatings.

FIG. 1 illustrates schematically and in an out-of-scale manner an upper surface of either a photovoltaic cell or solar cell (1), optionally tilted southwards. In this embodiment, at least corrugated transparent panel (100), made of e.g., glass or polymers (PMMA, poly carbonate etc.) provides as the top of cell (1). Its curves are configured to maximize absorption of solar irradiation. Hence, in early mornings, when sun rises (E), eastern slopes faces light (12); whilst at sunset, light (11) from western sun (W) faces western slopes. Midday, when sun set (10) up above, concaved/convex panel maximize harvesting of solar energy.

Figure 3A:
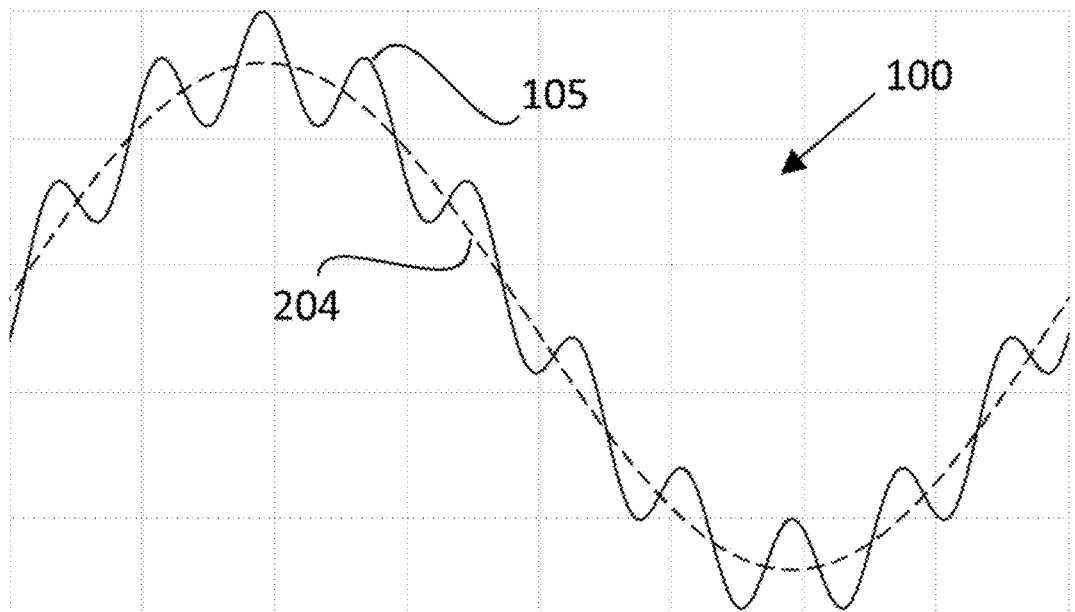
FIG. 3 schematically and in an out-of-scale manner illustrates in a non-limiting manner embodiment of secondary and tertiary corrugated transparent panels (100) according to other embodiments of the invention.

Reference is now made to FIG. 2A-C, schematically and in an out-of-scale manner illustrating in a non-limiting manner several embodiments of corrugated transparent panel (100). As schematically illustrated in FIG. 2A, the sinusoidal or otherwise evenly or non-evenly waved surface of cross section 101 comprises a lower portion (1015) and a higher portion (1014). This waved, oscillating or fluted-wave one or more portion of the panel is characterized by either stiff walls (cross section, FIG. 2B, 102) or slim walls (perspective front view, FIG. 2C, 103), where minimum lines and maximum lines are either perpendicular to the continuous sine wave (see FIG. 2A, lines 1014 and 1015) or at least partially tilted (e.g., linearly, curved or rounded) to its main perpendicular axis Reference is now made to FIG. 3A-D, where FIG. 3C schematically and in a non-limiting and out-of-scale manner illustrates a cross-section of a surface (100) of a transparent panel comprising a single sinusoid (204), FIG. 3A schematically and in a non-limiting and out-of-scale manner illustrates a cross-section of a surface (100) of a transparent panel with secondary sinusoidal corrugations (105) provided upon a primary sinusoidal wave (204), and FIGS. 3B and 3D schematically and in a non-limiting and out-of-scale manner illustrate a cross-section of a surface (100) of a transparent panel comprising secondary and tertiary sinusoidal corrugations (106) upon a primary sinusoidal wave (204).

If the surface is curved or otherwise comprises a plurality of angles relative to a plane comprising an average height of the surface, the angle between a perpendicular to the surface and the sun will be different on different positions on the surface. This is indicated schematically for a single sinusoid (204) in FIG. 3C. For a single sinusoid (204), the sun's rays will be perpendicular to the surface at some time of the day if the angle between the sun and the horizon is between 45° (162) and 90° (161).

Figure 3B:
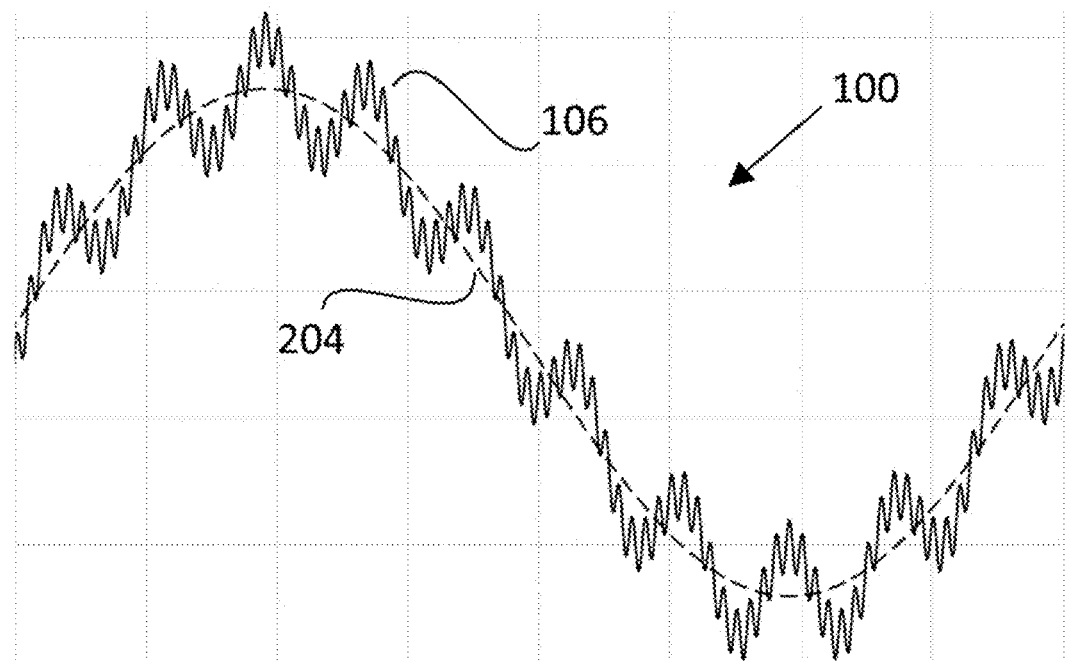
Figure 3C:
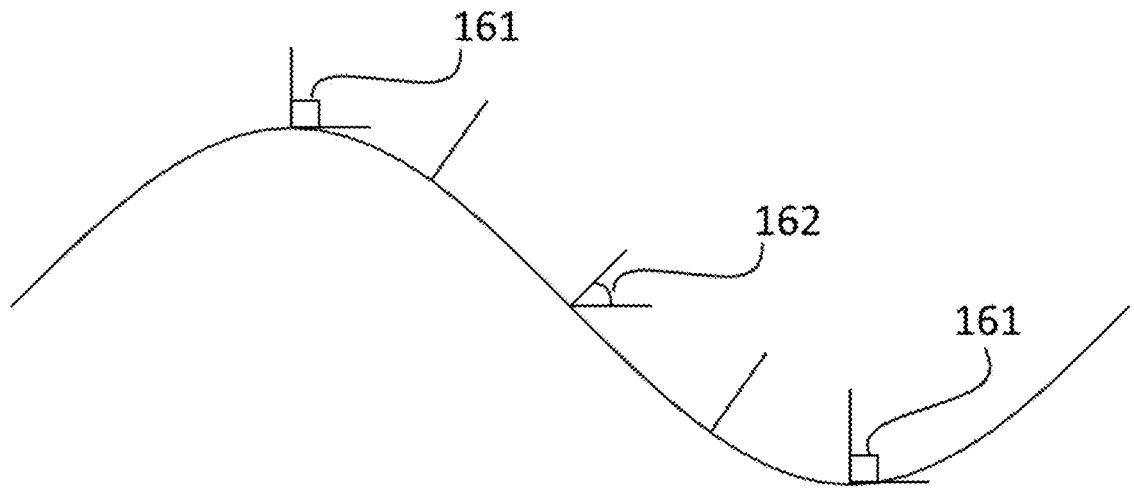
Figure 3D:
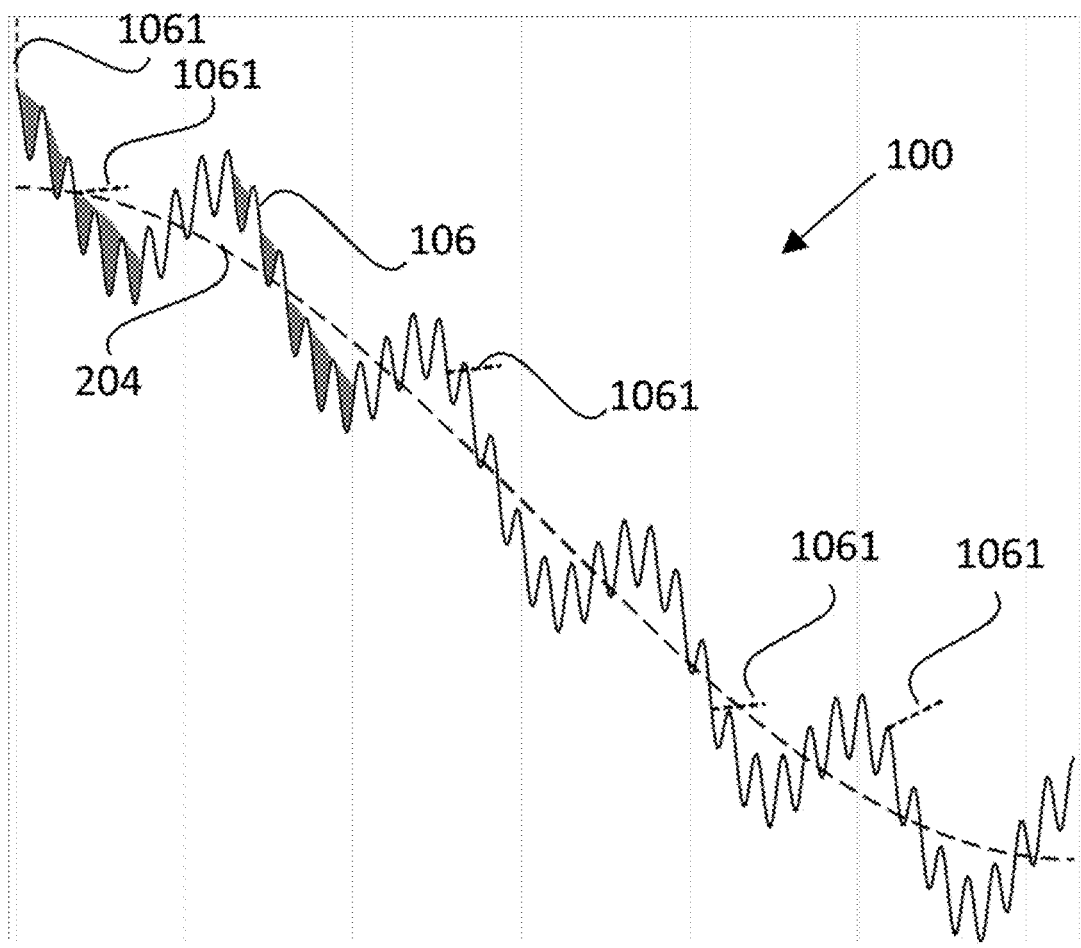
Figure 3E:
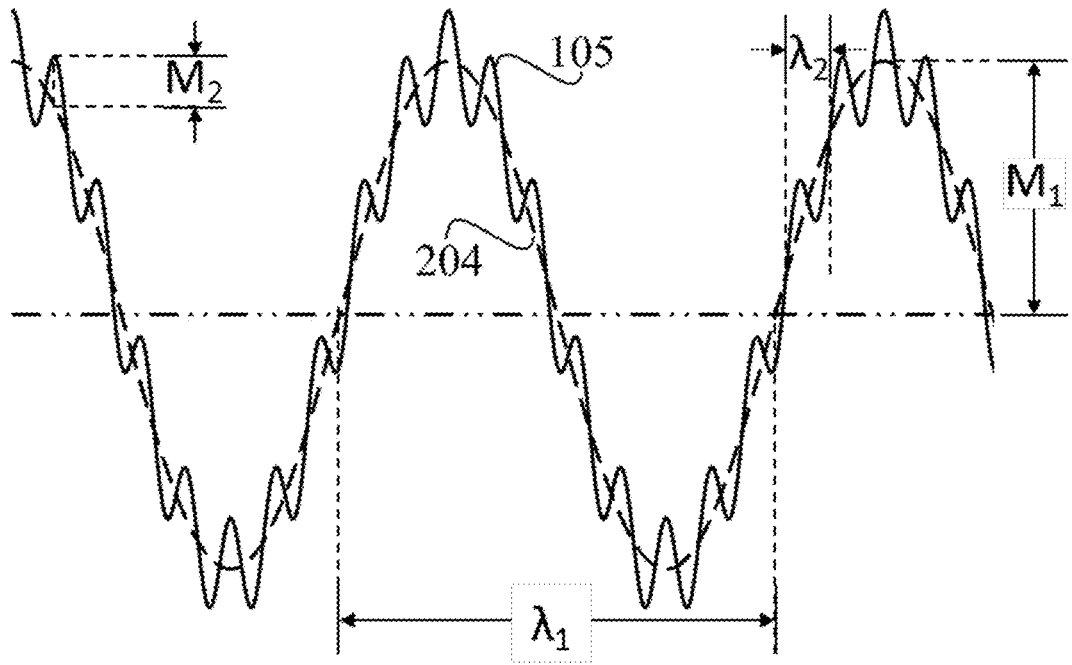
Figure 3F:
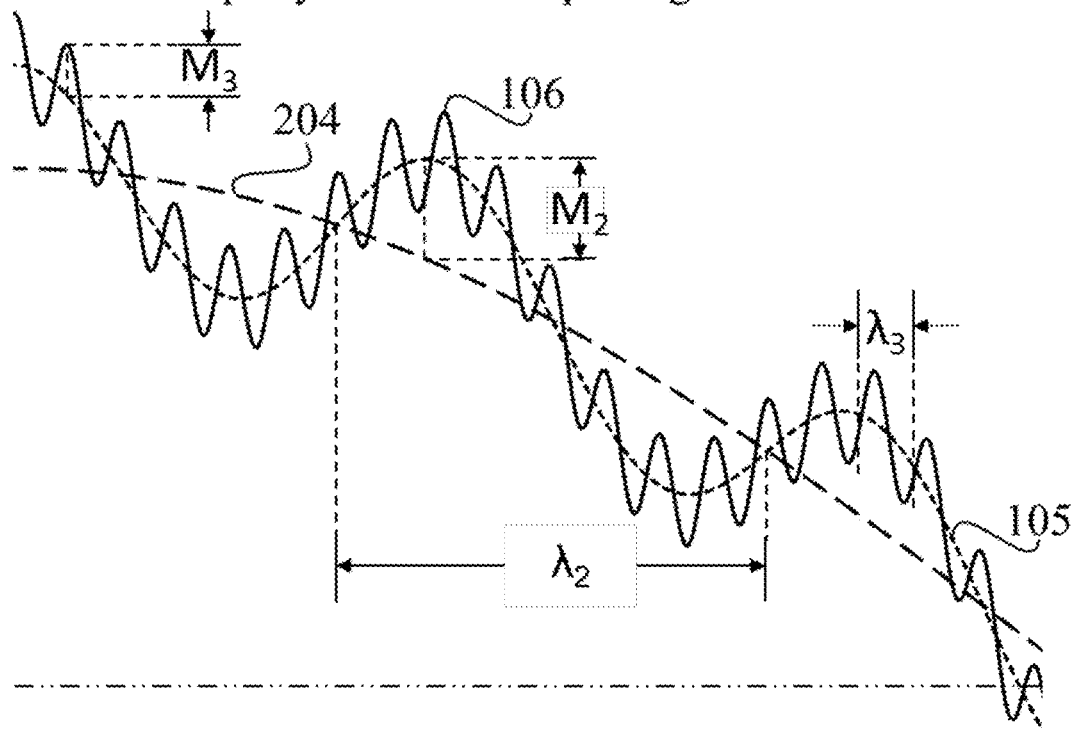

FIG. 3D schematically illustrates a portion of the surface (100) of FIG. 3B, which comprises three sine waves of different wavelengths. The dashed line (204) indicates the longest-wavelength sine wave, while the solid line (106) shows the surface. Perpendiculars (1061) are shown at several points on the surface (106). It can be seen that the range of angles formed by the perpendicular to the surface is greater for a surface with secondary and tertiary corrugations (106) than for the single sinusoid (204) of FIG. 3C. Table I shows the minimum angle formed by a perpendicular to a surface comprising either primary and secondary sinusoidal corrugations (third column), or primary, secondary and tertiary sinusoidal corrugations (fourth column). The maximum angle, in all cases, is 90°. In Table I, the frequency ratios vary while the magnitude ratios ($M_1:M_2$ and $M_1:M_3$) are kept constant.

TABLE I

| Ratio of Wavelengths $\lambda_1:\lambda_2$ | Ratio of Wavelengths $\lambda_1:\lambda_3$ | Minimum Angle, Surface is Sum of Sinusoids with Frequencies $f_1$ and $f_2$ (°) | Minimum Angle, Surface is Sum of Sinusoids with Frequencies $f_1$, $f_2$ and $f_3$ (°) |
| --- | --- | --- | --- |
| 5:1 | 25:1 | 26.5 | 12.5 |
| 6:1 | 30:1 | 24.8 | 11.0 |
| 6:1 | 36:1 | 24.8 | 9.9 |
| 10:1 | 50:1 | 18.5 | 5.4 |
| 10:1 | 80:1 | 18.5 | 11.6 |
| 10:1 | 100:1 | 18.5 | 4.4 |
| 10:1 | 160:1 | 18.5 | 3.1 |
| 11:1 | 101:1 | 17.6 | 4.4 |
| 11:1 | 110:1 | 17.6 | 4.1 |
| 12:1 | 110:1 | 16.4 | 4.0 |

From Table I, it can be seen that the third sinusoid significantly increases the range of angles over which the sun will be perpendicular to the surface, thereby increasing the portion of the day during which the sun is efficiently absorbed and decreasing the amount by which the surface needs to be rotated to follow the sun.

Tuning can also be done by varying the relative magnitudes of the secondary and tertiary corrugations relative to the primary corrugations. Table II shows some exemplary minimum angles for different relative magnitudes. All have the same relative wavelengths, $\lambda_1:\lambda_2$ is 6:1 and $\lambda_1:\lambda_3$ is 30:1. In all cases, the maximum angle is 90°.

TABLE II

| Ratio of Magnitudes $M_1:M_2$ | Ratio of Magnitudes $M_1:M_3$ | Minimum Angle, Surface is Sum of Sinusoids with Magnitudes $M_1$ and $M_2$ (°) | Minimum Angle, Surface is Sum of Sinusoids with Magnitudes $M_1$, $M_2$ and $M_3$ (°) |
| --- | --- | --- | --- |
| 1:2 | 1:20 | 14.2 | 10.4 |
| 1:5 | 1:10 | 24.8 | 11 |
| 1:5 | 1:20 | 24.8 | 15.3 |
| 1:10 | 1:10 | 32.5 | 12.4 |
| 1:10 | 1:20 | 32.5 | 18.1 |
| 1:30 | 1:60 | 40.5 | 31.0 |

In addition, in at least some part of the surface, the tertiary corrugations are close-packed, allowing multiple reflections and further increasing possible absorption of sunlight. Some exemplary areas where multiple reflections are likely to occur for at least some sun angles are schematically illustrated in grey in FIG. 3D. Other such areas, although not greyed, are clearly present. The amount of absorption by multiple reflection can be adjusted by adjusting the relative magnitudes of the secondary and tertiary corrugations relative to the primary corrugation and to each other. A smaller magnitude of the tertiary corrugations or a longer wavelength for the tertiary corrugations relative to the secondary corrugations will decrease the amount of absorption due to multiple reflection by decreasing the area where multiple reflections can occur.

For a structure such as that illustrated in FIG. 3D, in which the left-facing sides and the right-facing sides defined by the primary corrugation are mirror images of each other, the fraction of sunlight absorbed at a given amount of time before local noon will be the same as the fraction of sunlight absorbed at the same amount of time after local noon.

Aforesaid primary, secondary, tertiary arrangements are merely an example for macro structures, e.g., scaled from 0.01 cm to 1 cm, from 1 cm to 100 cm, from 100 cm to 1500 cm; and/or micro-structures, e.g., scaled from 0.01 μm to 1 μm, from 1 μm to 100 μm, from 100 to 1,500 μm; or nano-structures, e.g., scaled from 1 nm to 100 nm, from 100 nm to 500 nm, from 500 nm to 1,000 nm. Aforesaid primary, secondary, tertiary arrangements are at least partially provided in a liquid phase, solid phase or any mixture thereof, flexible, semi-flexible or inflexible or rigid mode.

In preferred embodiments, the frequency of the secondary corrugations is at least five times the frequency of the primary corrugations, and the frequency of the tertiary corrugations is at least five times the frequency of the secondary corrugations, so that the frequency of the tertiary corrugations is at least 25 times the frequency of the primary corrugations. In other words, the wavelength of the secondary corrugations is no more than ⅕ the wavelength of the primary corrugations, and the wavelength of the tertiary corrugations is no more than ⅕ the wavelength of the secondary corrugations.

The secondary corrugations can be of the same material as the primary corrugations, with a varying refractive index across the surface generated by the varying thickness of the material caused by the primary and secondary corrugations, the secondary corrugations can be of a different material than the primary corrugations, with the two materials having a different refractive index and any combination thereof.

The tertiary corrugations can be of the same material as the secondary corrugations, with a varying refractive index across the surface generated by the varying thickness of the material caused by the secondary and tertiary corrugations, the tertiary corrugations can be of a different material than the secondary corrugations, with the two materials having a different refractive index and any combination thereof.

Figure 4:
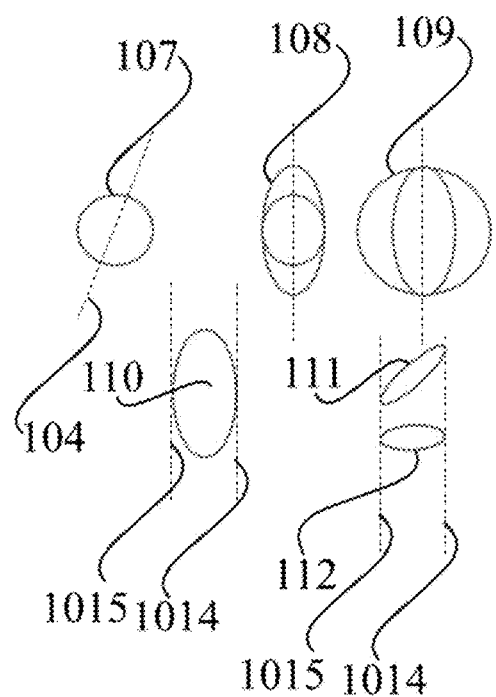
FIG. 4 schematically and in an out-of-scale manner illustrates in a non-limiting manner several embodiments of the macro, micro or nano structures according to another embodiment of the invention.

Reference is now made to FIG. 4, schematically and in an out-of-scale manner illustrates in a non-limiting manner several embodiments of the macro, micro or nano structures wherein their top view is substantially rounded 107, provided in top or bottom wave line (104) and/or anywhere in-between those lines, rounded top and ellipsoidal base 108, rounded base and top 109, ellipsoidal arrangement (110) having a main longitudinal axis being parallel to wave base 1015 and/or top 104b lines; and ellipsoidal arrangement (110) having a main longitudinal axis being parallel to wave base 1015 line and/or top 1014 line, tertiary ellipsoidal arrangement and secondary arrangement (111,112, respectively) having a main longitudinal axis being tilted or perpendicular to either or both wave base 1015 and/or top 1014.

Figure 5:
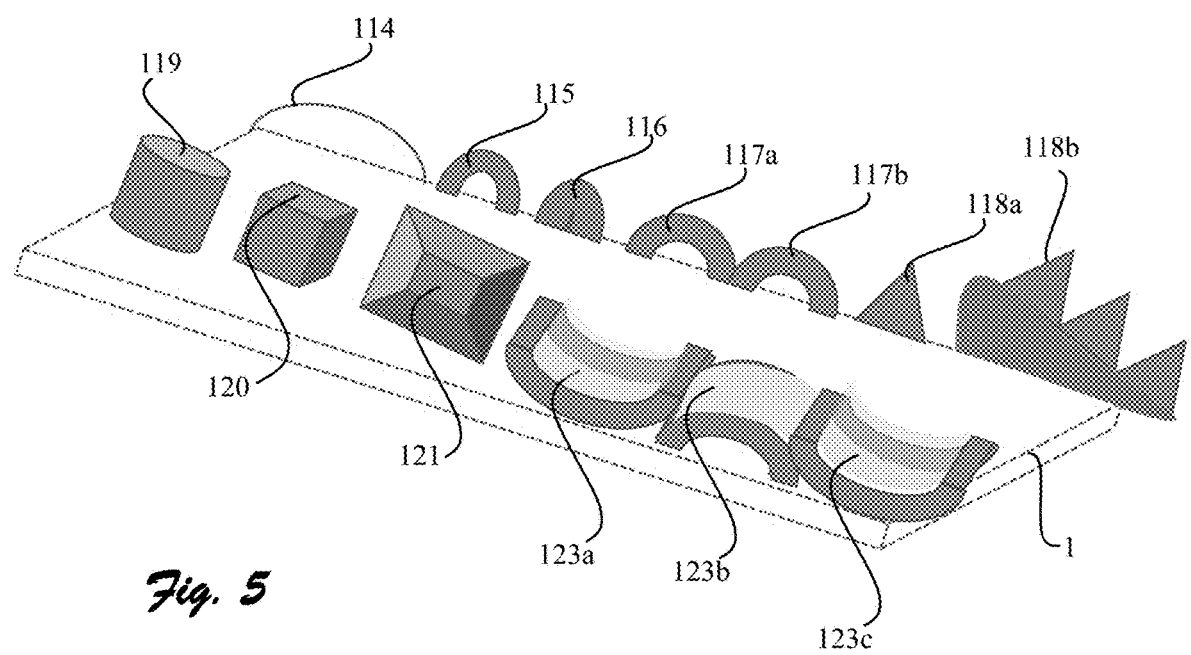
FIG. 5 schematically and in an out-of-scale manner illustrates in a non-limiting manner several embodiments of the macro-, micro- or nano-structures according to another embodiment of the invention.

Reference is now made to FIG. 5, schematically and in an out-of-scale manner illustrates in a non-limiting manner several embodiments of the macro-, micro- or nano-structures, on either planar (1) or texturized (waved etc.) plane, wherein cross section of a concave shaped structure is at least partially, homogenously or heterogeneously having a very thin wall (nano-scale 114), wider wall (micro-scale, 115) or is filled member (116). The primary (118a), secondary (118b), tertiary arrangements structures can be rectangular, circular or otherwise shaped. Hence, as shown in a 3D perspective manner, substantially tubular structures (119), substantially cubic structures (120), substantially pyramidal structures (121) shapes or any mixture and combination thereof (e.g., concave 123a, c and convex 123b integrated or non-integrated multiple or singular structures, respectively, are provided useful.

The present device provides a corrugated surface where the corrugations are controllable, tunable and regular. The corrugations, including the tertiary corrugations, are preferably significantly longer than they are wide, unlike etched structures which are dependent on the crystallinity of the substrate so that etched structures on a crystalline material are typically approximately equi-axed. Furthermore, etching of an amorphous material reduces the thickness of the amorphous layer approximately evenly; no semi-regular peaks which are usable for refracting sunlight are produced.

Corrugations that are at least partially curved in cross-section and are preferably significantly longer than they are wide will more efficiently capture sunlight than approximately equi-axed structures that have flat sides. For example, for pyramidal structures, if the structure is aligned so that east-facing sides of the pyramids face the morning sun and the west-facing sides of the pyramids face the afternoon sun, then, when the sunlight is perpendicular to the sun-facing surfaces for an angle in a horizontal plane, approximately half of the sunlight will miss the surfaces entirely, by passing between the adjacent pyramids. If the sunlight strikes the sunward-facing surfaces at a horizontally-oblique angle, some of the sunlight will strike the south-facing surfaces, but such sunlight will strike the south-facing surfaces at a glancing angle and thus will not be efficiently absorbed, since, if the sunlight strikes east-facing sides of pyramids at an oblique, horizontal, angle of $\theta_h$, then it will strike south (or north) facing sides at an angle of $(90-\theta_h)$; for $\theta_h$ close to 90° for efficiency in capture for east (or west) facing slopes, $(90-\theta_h)$ will be close to 0 and capture will be inefficient.

In the device of the present invention, with corrugations significantly longer than they are wide, the gaps between capturing sections are relatively small to non-existent, so that most to all of the east-facing (or west-facing) slopes will capture sunlight, whatever the horizontal angle of the sunlight and the horizontally oblique angle at which the sunlight strikes the corrugations will be the same for most if not all of the corrugations.

In addition, the longer-wavelength corrugations are more efficient at trapping long wavelength light, whereas the shorter-wavelength corrugations are more efficient at trapping the short-wavelength light, thereby making absorption of light more efficient across the wavelength spectrum and ensuring more even absorption across a day, where the early morning, late evening light comprises more long-wavelength than the midday sun, which loses less short-wavelength light to atmospheric and dust absorption.

Figure 6:
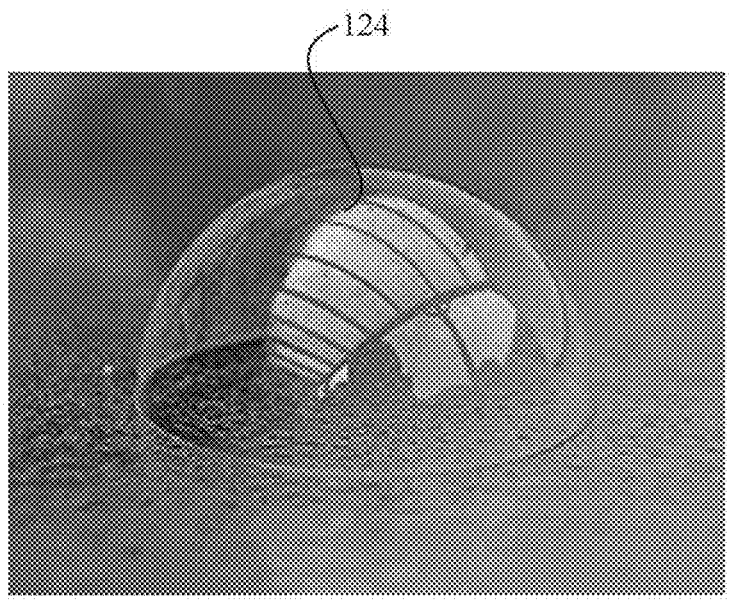
FIGS. 6 and 7 disclose a half-bubble-like microsphere (124) and light projecting/intensifying glass-like lens-like macro-structure (125) according to yet other embodiments of the invention.
Figure 7:
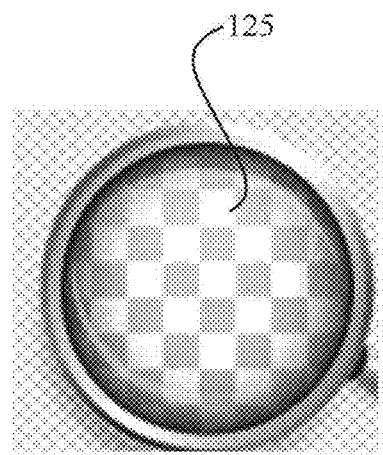

FIGS. 6 and 7 discloses a half-bubble-like microsphere (124) and light projecting/intensifying glass-like lens-like macro-structure (125) according to yet other embodiments of the invention.

Figure 8:
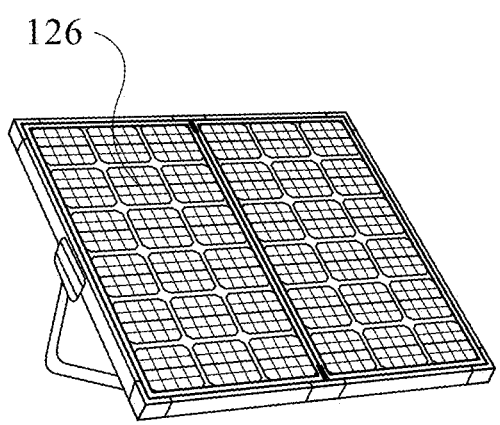
FIGS. 8 and 9 disclose a solar/photovoltaic cell with panel (126) and greenhouse with panel (127) according to yet other embodiments of the invention.
Figure 9:
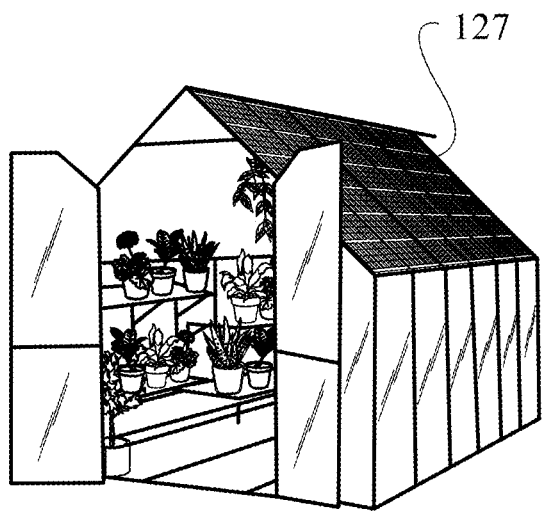

FIGS. 8 and 9 discloses a solar/photovoltaic cell with panel (126) and greenhouse with panel (127) according to yet other embodiments of the invention.

The invention claimed is:

1. A transparent top panel (100) for an exterior surface of a photovoltaic or solar cell, said transparent top panel comprising an exterior surface, having a layer configured for scattering and diffracting a solar light incident thereto, said layer comprising:
   distance-$d_1$-spaced primary corrugations made of a transparent composition; and,
   said primary corrugations further comprising distance-$d_2$-spaced secondary corrugations by means of varying of a thickness or a refractive index thereof within said primary corrugations;

said first distance $d_1$ is at least 5 times said second distance $d_2$;
wherein:
said secondary corrugations further comprise distance $d_3$-spaced tertiary corrugations by means of varying of a thickness or a refractive index thereof within said secondary corrugations;
said second distance $d_2$ is at least 5 times said third distance $d_3$;
said primary corrugations form a regular, evenly-spaced pattern on said substrate, said secondary corrugations form a regular, evenly-spaced pattern on said primary corrugations and said tertiary corrugations form a regular, evenly-spaced pattern on said secondary corrugations;
a cross-section of said tertiary corrugations comprises a plurality of different slopes;
said corrugations each comprise a base with a two-dimensional shape; and,
each of said first distance $d_1$, said second distance $d_2$, and said third distance $d_3$ remains constant along said transparent top panel.

2. The transparent top panel (100) of claim 1, wherein a first shape of said primary corrugations is an at least partially transparent lens-like arrangement selected from the group consisting of circular cross-section, ellipsoidal cross-section and lenticular.

3. The transparent top panel (100) of claim 2, wherein a second shape of said primary corrugations is an at least partially transparent lens-like arrangement selected from the group consisting of tubular, cubic, truncated rectangular pyramid, spherical, and ellipsoidal.

4. The transparent top panel (100) of claim 1, wherein a first shape of said secondary corrugations is an at least partially transparent lens-like arrangement selected from the group consisting of circular cross-section, ellipsoidal cross-section and lenticular.

5. The transparent top panel (100) of claim 4, wherein a second shape of said secondary corrugations is an at least partially transparent lens-like arrangement selected from the group consisting of tubular, cubic, truncated rectangular pyramid, spherical, and ellipsoidal.

6. The transparent top panel (100) of claim 1, wherein a first shape of said tertiary corrugations is an at least partially transparent lens-like arrangement selected from the group consisting of circular cross-section, ellipsoidal cross-section and lenticular.

7. The transparent top panel (100) of claim 6, wherein a second shape of said tertiary corrugations is an at least partially transparent lens-like arrangement selected from the group consisting of tubular, cubic, truncated rectangular pyramid, spherical, and ellipsoidal.

8. The transparent top panel (100) of claim 1, wherein at least one of the following is true:
a cross-section of a member of the group consisting of said primary corrugations, said secondary corrugations and any combination thereof comprises a plurality of different slopes; and
at least a portion of a cross-section of a member of the group consisting of said primary corrugations, said secondary corrugations, said tertiary corrugations and any combination thereof is curved.

9. A transparent top panel (100) for providing a selected range of incident angles at which solar light is perpendicular to the exterior surface of a photovoltaic or solar cell; wherein a layer of said panel comprises distance-$d_1$-spaced primary, substantially sinusoidal corrugations of magnitude $M_1$; said primary corrugations further comprising distance-$d_2$-spaced secondary, substantially sinusoidal corrugations of magnitude $M_2$; said secondary corrugations further comprising distance $d_3$-spaced tertiary, substantially sinusoidal corrugations of magnitude $M_3$;
wherein $d_3 < d_2 < d_1$; and,
one or more parameters comprising distance ratios $d_1:d_2$ and $d_1:d_3$ are configured for a selected said range of incident angles.

10. The panel of claim 9, wherein said spacing ratio $d_1:d_2$ is at least 5 and said spacing ratio $d_1:d_3$ is at least 25.

11. The panel of claim 9, wherein said parameters configured for a said chosen range of incident angles further comprise the magnitude ratios $M_1:M_2$ and $M_1:M_3$.

12. The panel of claim 11, wherein said magnitude ratios are further selected from a range configured to trap of light from multiple reflections.

13. The panel of claim 9, made of polymer(s), glass(es), sol(s), gel(s), sol-gel(s), composite material(s) and any mixture or combination thereof.

14. The panel of claim 9, wherein said panel comprises a first surface and a second opposite surface said second surface is interconnected with or otherwise comprises an adhesive, glue or fixating means.

15. A method for optimizing an incident angle for collecting solar light at the exterior surface of a photovoltaic or solar cell, said method comprising providing a transparent top panel (100) of claim 1.

16. A transparent top panel (100) for an exterior surface of a photovoltaic or solar cell, said transparent top panel comprising an exterior surface, having a layer configured for scattering and diffracting a solar light incident thereto; wherein:
said layer comprises primary, secondary and tertiary corrugations;
said primary corrugations comprise secondary corrugations, said secondary corrugations characterized by a varying thickness or refractive index thereof within said primary corrugations;
said secondary corrugations comprise tertiary corrugations; and,
at least a portion of said corrugations comprises a base with a two-dimensional shape.

17. A method for optimizing an incident angle for collecting a solar light at the exterior surface of a photovoltaic or solar cell, said method comprising a transparent top panel (100) of claim 16.

18. The transparent top panel according to claim 9, wherein said the distances $d_1$, $d_2$, $d_3$ are selected such that said transparent top panel is configured to absorb light from a minimum incident angle of 10 degrees.

19. The transparent top panel according to claim 11, wherein said magnitude ratios $M_1:M_2$ and $M_1:M_3$ are selected such that said transparent top panel is configured to absorb light from a minimum incident angle of 10 degrees.

* * * * *